(12) United States Patent  
Zhang

(10) Patent No.: US 11,637,265 B2
(45) Date of Patent: Apr. 25, 2023

(54) DISPLAY SUBSTRATE HAVING PIXEL DEFINITION LAYER COMPRISES A LYOPHILIC AND LYOPHOBIC MATERIALS

(71) Applicant: BOE TECHNOLOGY GROUP CO., LTD., Beijing (CN)

(72) Inventor: Yue Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 290 days.

(21) Appl. No.: 16/853,097

(22) Filed: Apr. 20, 2020

(65) Prior Publication Data

US 2021/0083219 A1  Mar. 18, 2021

(30) Foreign Application Priority Data

Sep. 18, 2019 (CN) .......................... 201910883379.8

(51) Int. Cl.
*H01L 27/32* (2006.01)
*H01L 51/50* (2006.01)
(Continued)

(52) U.S. Cl.
CPC ....... *H01L 51/5088* (2013.01); *G09G 3/3258* (2013.01); *H01L 51/5212* (2013.01); *H01L 51/56* (2013.01); *G09G 2300/0439* (2013.01)

(58) Field of Classification Search
CPC . H01L 27/3241; H01L 27/3246; H01L 50/50; H01L 50/5084; H01L 50/5088;
(Continued)

(56) References Cited

U.S. PATENT DOCUMENTS 10,355,061 B2 * 7/2019 Yeo ..................... H01L 27/3279
11,088,347 B2   8/2021 Lee et al.
(Continued)

FOREIGN PATENT DOCUMENTS

CN    104073767 A    10/2014
CN    107579099 A    1/2018
(Continued)

OTHER PUBLICATIONS

Chinese Office Action in Chinese Application No. 201910883379.8 dated Jun. 15, 2021 with English translation.

*Primary Examiner* — Hoai V Pham
(74) *Attorney, Agent, or Firm* — Collard & Roe, P.C.

(57) ABSTRACT

Disclosed are a display substrate, a preparation method thereof, and a display apparatus. The display substrate includes: a driving substrate, a first electrode, an auxiliary electrode, a pixel definition layer and a hole injection layer. The driving substrate includes a driving circuit and a dielectric layer covering the driving circuit; the first electrode and the auxiliary electrode are on a side of the dielectric layer of the driving substrate away from the driving circuit; the auxiliary electrode at least partially surrounds the first electrode; the pixel definition layer is on a side of the first electrode and the auxiliary electrode away from the driving substrate; the pixel definition layer includes a pixel opening, and the first electrode is at least partially exposed through the pixel opening and is electrically connected to the driving circuit; and the hole injection layer is in the pixel opening and stacked with the first electrode.

13 Claims, 3 Drawing Sheets

(51) Int. Cl.
  *G09G 3/3258* (2016.01)
  *H01L 51/52* (2006.01)
  *H01L 51/56* (2006.01)

(58) Field of Classification Search
  CPC ............. H01L 50/5092; H01L 50/5212; H01L 50/5228
  USPC ..................................................... 257/40, 59
  See application file for complete search history.

(56) References Cited

U.S. PATENT DOCUMENTS

2004/0246309 A1  12/2004  Watanabe
2015/0280130 A1* 10/2015  Sago ................... H01L 51/0005
                                                   438/46
2020/0295103 A1   9/2020  Zou et al.

FOREIGN PATENT DOCUMENTS

| CN | 107665958 A | 2/2018 |
| CN | 109920825 A | 6/2019 |
| CN | 110137366 A | 8/2019 |

\* cited by examiner

DISPLAY SUBSTRATE HAVING PIXEL DEFINITION LAYER COMPRISES A LYOPHILIC AND LYOPHOBIC MATERIALS

CROSS-REFERENCE TO RELATED APPLICATIONS

The application claims priority to the Chinese patent application No. 201910883379.8, filed on Sep. 18, 2019. For all purposes under the U.S. Law, the entire disclosure of the aforementioned application is incorporated by reference as part of the disclosure of this application.

TECHNICAL FIELD

At least one embodiment of the present disclosure relates to a display substrate and a preparation method of the display substrate, and a display apparatus.

BACKGROUND

Compared with a liquid crystal display panel (LCD), an organic light emitting diode (OLED) display panel has advantages of self-luminescence, fast response, wide viewing angle, high brightness, bright color, light weight, thin thickness, etc., and is considered as a main display technology of next generation. The OLED generally includes an anode layer, a pixel definition layer, a hole injection layer, a hole transport layer, a light emitting layer, an electron transport layer, a hole injection layer, a cathode layer and other structures which are sequentially formed on a base substrate.

SUMMARY

At least one embodiment of the present disclosure provides a display substrate, and the display substrate includes a driving substrate, a first electrode, an auxiliary electrode, a pixel definition layer, and a hole injection layer. The driving substrate includes a driving circuit and a dielectric layer covering the driving circuit; the first electrode and the auxiliary electrode are on a side of the dielectric layer of the driving substrate away from the driving circuit; the auxiliary electrode at least partially surrounds the first electrode; the pixel definition layer is on a side of the first electrode and the auxiliary electrode away from the driving substrate; the pixel definition layer includes a pixel opening, and the first electrode is at least partially exposed through the pixel opening and is electrically connected to the driving circuit; and the hole injection layer is in the pixel opening and stacked with the first electrode.

For example, in at least one example of the display substrate, the display substrate includes a plurality of first electrodes and a plurality of hole injection layers; the pixel definition layer includes a plurality of pixel openings; the plurality of first electrodes are at least partially exposed through the plurality of pixel openings, respectively.

For example, in at least one example of the display substrate, the display substrate further includes a plurality of pixel regions and a plurality of OLED devices respectively corresponding to the plurality of pixel regions; the plurality of pixel openings respectively define the plurality of pixel regions; and each of the plurality of OLED devices includes a corresponding first electrode of the plurality of first electrodes and a corresponding hole injection layer of the plurality of hole injection layers.

For example, in at least one example of the display substrate, each of the plurality of OLED devices further includes a light emitting layer and an electron injection layer; the light emitting layer is on a side of the corresponding hole injection layer away from the driving substrate; and the electron injection layer is on a side of the light emitting layer away from the driving substrate.

For example, in at least one example of the display substrate, a thickness h1 of the first electrode in a direction perpendicular to the driving substrate is less than or equal to a thickness h2 of the auxiliary electrode in the direction perpendicular to the driving substrate, and h2 is less than or equal to 5000 Å.

For example, in at least one example of the display substrate, a thickness of a stacked layer consisting of the hole injection layer and the first electrode in the direction perpendicular to the driving substrate is less than the thickness of the auxiliary electrode in the direction perpendicular to the driving substrate.

For example, in at least one example of the display substrate, an orthographic projection of the auxiliary electrode on the driving substrate is within an orthographic projection of the pixel definition layer on the driving substrate.

For example, in at least one example of the display substrate, the auxiliary electrode completely surrounds the first electrode and is spaced apart from the first electrode.

For example, in at least one example of the display substrate, the pixel definition layer includes a lyophilic material layer on a side of the first electrode and the auxiliary electrode facing away from the driving substrate, and a lyophobic material layer on a side of the lyophilic material layer facing away from the driving substrate.

For example, in at least one example of the display substrate, a thickness of the lyophilic material layer in a direction perpendicular to the driving substrate is greater than a thickness of the first electrode in the direction perpendicular to the driving substrate; the thickness of the lyophilic material layer in the direction perpendicular to the driving substrate is less than a thickness of the auxiliary electrode in the direction perpendicular to the driving substrate; and the auxiliary electrode is in direct contact with the lyophobic material layer.

For example, in at least one example of the display substrate, the thickness of the lyophilic material layer in the direction perpendicular to the driving substrate is greater than a thickness of a stacked layer consisting of the hole injection layer and the first electrode in the direction perpendicular to the driving substrate.

For example, in at least one example of the display substrate, a material of the hole injection layer includes poly(3,4-ethylenedioxythiophene):poly(styrene sulfonic acid) (PEDOT:PSS).

For example, in at least one example of the display substrate, the driving circuit includes a pixel circuit and an electrode terminal; the pixel circuit is configured to receive a gate signal and a data signal, and to generate a driving current based on the gate signal and the data signal; the first electrode is electrically connected to the pixel circuit to receive the driving current generated by the pixel circuit; and the auxiliary electrode is electrically connected to the electrode terminal to receive a ground voltage supplied to the electrode terminal by the driving circuit.

For example, in at least one example of the display substrate, the auxiliary electrode is floating or grounded in operation.

For example, in at least one example of the display substrate, the display substrate includes a plurality of pixel regions, the plurality of pixel regions are arranged in an array, and the auxiliary electrode is between adjacent two columns of the pixel regions or/and between adjacent two rows of the pixel regions; a material of the auxiliary electrode includes at least one selected from the group consisting of magnesium, silver, copper or aluminum; and a thickness of the auxiliary electrode is 4500 Å~5500 Å.

At least one embodiment of the present disclosure further provides a display apparatus, and the display apparatus includes the display substrate provided by at least one embodiment.

At least one embodiment of the present disclosure provides a preparation method of a display substrate, and the preparation method of the display substrate includes: providing a driving substrate, wherein the driving substrate includes a driving circuit and a dielectric layer covering the driving circuit; forming a first electrode and an auxiliary electrode on a surface of the dielectric layer of the driving substrate away from the driving circuit, wherein the auxiliary electrode at least partially surrounds the first electrode; forming a pixel definition layer on the driving substrate formed with the first electrode and the auxiliary electrode, wherein the pixel definition layer includes a pixel opening, and the first electrode is at least partially exposed through the pixel opening and is electrically connected to the driving circuit; injecting a hole injection layer solution into the pixel opening, wherein the hole injection layer solution exhibits a first electrical property; applying voltages with opposite electrical properties to the first electrode and the auxiliary electrode, respectively, so that the first electrode exhibits a second electrical property opposite to the first electrical property, and the auxiliary electrode exhibits the first electrical property; and drying the hole injection layer solution into a film to form the hole injection layer under a condition that the first electrode is kept to exhibit the second electrical property and the auxiliary electrode is kept to exhibit the first electrical property.

For example, in at least one example of the preparation method, the forming the first electrode and the auxiliary electrode on the surface of the dielectric layer of the driving substrate away from the driving circuit includes: forming a plurality of first electrodes and the auxiliary electrodes on the driving substrate; the pixel definition layer includes a plurality of pixel openings, and the plurality of pixel openings respectively define a plurality of pixel regions of the display substrate; the plurality of first electrodes are at least partially exposed through the plurality of pixel openings, respectively; and the injecting the hole injection layer solution into the pixel opening includes: injecting the hole injection layer solution into the plurality of pixel openings, respectively, so as to form a plurality of hole injection layers in the plurality of pixel openings, respectively.

For example, in at least one example of the preparation method, the first electrical property is a negative electrical property, and the second electrical property is a positive electrical property; and the applying the voltages with opposite electrical properties to the first electrode and the auxiliary electrode, respectively, includes: applying a positive voltage to the first electrode and a negative voltage to the auxiliary electrode.

For example, in at least one example of the preparation method, a material of the hole injection layer includes PEDOT:PSS, and the hole injection layer solution is a dispersion formed by PEDOT:PSS in water.

For example, in at least one example of the preparation method, the forming the pixel definition layer on the driving substrate formed with the first electrode and the auxiliary electrode includes: forming a lyophilic material layer on the driving substrate formed with the first electrode and the auxiliary electrode; and forming a lyophobic material layer on a side of the lyophilic material layer away from the driving substrate. And the lyophilic material layer includes a first sub-opening, the lyophobic material layer includes a second sub-opening, and the first sub-opening and the second sub-opening form the pixel opening.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE NUMERALS

Figure 1:
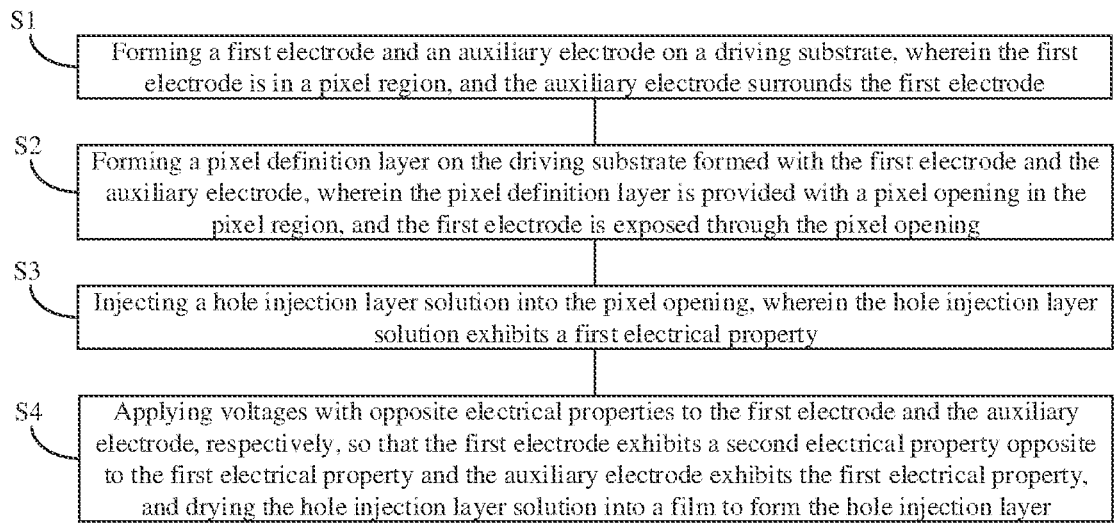
FIG. 1 is a flowchart of a preparation method of a display substrate provided by at least one embodiment of the present disclosure.

10—driving substrate; 21—first electrode; 22—auxiliary electrode; 23—pixel definition layer; 231—lyophilic material layer; 232—lyophobic material layer; 24—hole injection layer.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

A film-forming method of an OLED device mainly includes a vapor deposition process or a solution process. The film-forming method adopting the vapor deposition process is more mature in the application of small-size display panels and has been used in mass production at present. The film-forming methods adopting the solution process mainly include ink jet printing, nozzle coating, spin coating, screen printing, etc., among which ink jet printing technology is considered as an important way to realize mass production of large-size OLED display panels because the ink jet printing technology has a high material utilization rate and can realize display panels in a large size.

The inventor of the present disclosure has found in research that the film in the pixel region of the OLED device formed by the ink jet printing technology may be uneven, which leads to uneven light emission of the OLED device.

When forming the OLED device by an ink jet printing process, it is necessary to form an anode layer on a base substrate, and then form a pixel definition layer (PDL) on the base substrate formed with the anode layer, so as to limit ink droplets to accurately flow into a designated pixel region. In a step of drying and film formation in the ink jet printing process, solvent vapor volatilizes rapidly at an edge of the pixel region, which causes droplets to flow from the center of the pixel region to the edge of the pixel region. This flow causes solute to migrate to the edge of the pixel region and eventually deposit at the edge, so as to form a deposition morphology with a thicker edge and a thinner center which is called "coffee ring effect", thus causing an uneven film in the pixel region and uneven light emission of the OLED device.

In addition, in the step of drying and film formation in the ink jet printing process, the ink droplets may climb along a lyophilic bottom surface of the pixel definition layer to a lyophobic top surface of the pixel definition layer. The thicker the material of the pixel definition layer is, the higher the ink droplets climbs. Therefore, the thickness uniformity of the pixel definition layer has a large impact on the display quality. And therefore, it is necessary to improve the thickness uniformity of the pixel definition layer.

At least one embodiment of the present disclosure provides a display substrate, a preparation method thereof, and a display apparatus. The preparation method of the display substrate includes: providing a driving substrate, wherein the driving substrate includes a driving circuit and a dielectric layer covering the driving circuit; forming a first electrode and an auxiliary electrode on a surface of the dielectric layer of the driving substrate away from the driving circuit, wherein the auxiliary electrode at least partially surrounds the first electrode; forming a pixel definition layer on the driving substrate formed with the first electrode and the auxiliary electrode, wherein the pixel definition layer has a pixel opening, and the first electrode is at least partially exposed through the pixel opening and is electrically connected to the driving circuit; injecting a hole injection layer solution into the pixel opening, wherein the hole injection layer solution exhibits a first electrical property; applying voltages with opposite electrical properties to the first electrode and the auxiliary electrode, respectively, so that the first electrode exhibits a second electrical property opposite to the first electrical property, and the auxiliary electrode exhibits the first electrical property; and drying the hole injection layer solution into a film to form a hole injection layer under a condition that the first electrode is kept to exhibit the second electrical property and the auxiliary electrode is kept to exhibit the first electrical property. The preparation method of the display substrate can improve the uniformity of films (e.g., hole injection layer) formed in pixel opening.

For example, the step of forming the first electrode and the auxiliary electrode on the surface of the dielectric layer of the driving substrate away from the driving circuit includes: forming a plurality of first electrodes and the auxiliary electrode on the driving substrate. The pixel definition layer has a plurality of pixel openings, and the plurality of pixel openings respectively define a plurality of pixel regions of the display substrate; the plurality of first electrodes are exposed at least partially through the plurality of pixel openings, respectively. The step of injecting the hole injection layer solution into the pixel opening includes: injecting the hole injection layer solution into the plurality of pixel openings, respectively, so as to form a plurality of hole injection layers in the plurality of pixel openings, respectively.

For example, the display substrate includes a plurality of pixel regions and a plurality of OLED devices respectively corresponding to the plurality of pixel regions; each of the plurality of OLED devices includes a corresponding first electrode and a corresponding hole injection layer. For example, the pixel region is a region where the pixel opening is located.

The display substrate, the preparation method thereof and the display apparatus provided by the embodiments of the present disclosure are described below in a non-limiting way through some examples or embodiments. As described below, different features in the specific examples or embodiments can be combined with each other in case of no conflict, so as to obtain new examples or embodiments, and these new examples or embodiments are also within the protection scope of the present disclosure.

FIG. 1 is a schematic diagram of a preparation method of a display substrate provided by at least one embodiment of the disclosure. For example, the display substrate can be an OLED display substrate, and the display substrate includes a plurality of OLED devices. As illustrated in FIG. 1, the preparation method of the display substrate includes the following steps S1-S4.

Step S1: forming a first electrode and an auxiliary electrode on a driving substrate, wherein the first electrode is in a pixel region, the auxiliary electrode surrounds (e.g., completely surrounds) the first electrode, and the pixel region is a region where an OLED device are located. For example, the first electrode is an anode of the display substrate.

Step S2: forming a pixel definition layer on the driving substrate formed with the first electrode and the auxiliary electrode, wherein the pixel definition layer is provided with a pixel opening in the pixel region, and the first electrode is exposed through the pixel opening.

Step S3: injecting a hole injection layer solution into the pixel opening, wherein the hole injection layer solution exhibits a first electrical property.

Step S4: applying voltages with opposite electrical properties to the first electrode and the auxiliary electrode, respectively, so that the first electrode exhibits a second electrical property opposite to the first electrical property, and the auxiliary electrode exhibits the first electrical property, and drying the hole injection layer solution into a film to form the hole injection layer.

Figure 2:
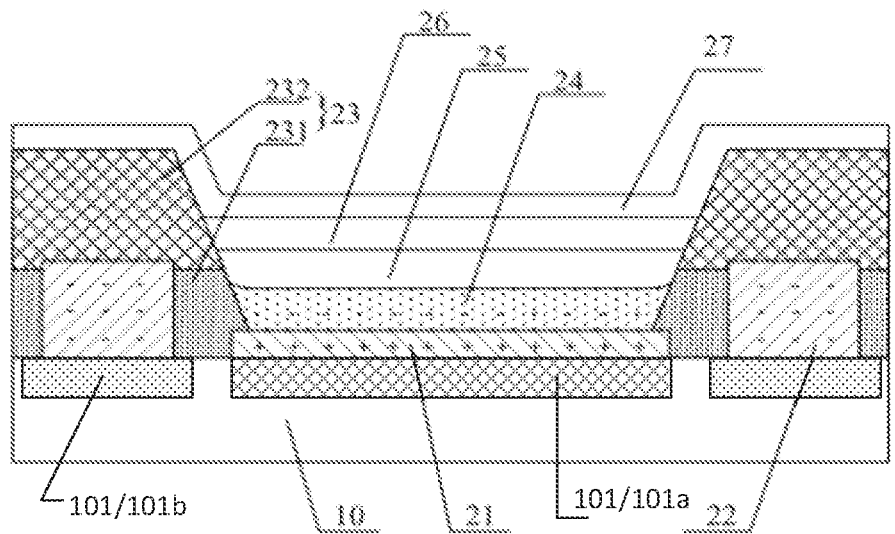
FIG. 2 is a schematic cross-sectional view of a display substrate formed by adopting the preparation method of the display substrate provided by at least one embodiment of the present disclosure.

FIG. 2 is a schematic cross-sectional view of a display substrate formed by adopting the preparation method of the display substrate provided by at least one embodiment of the present disclosure.

In FIG. 2, the state of the display substrate during the process of drying and film formation of the hole injection layer solution is illustrated. A first electrode 21 located in the pixel region is formed on a driving substrate 10; an auxiliary electrode 22 surrounding the first electrode 21 is also formed on the driving substrate 10. For example, the first electrode 21 is electrically connected to a corresponding thin film transistor (a driving transistor) of a pixel circuit in a driving structure layer, so that a corresponding voltage can be applied to the first electrode 21 by the driving substrate 10. For example, the auxiliary electrode 22 is electrically connected to the driving structure layer of the driving substrate 10, so that a corresponding voltage can be applied to the auxiliary electrode 22 by the driving substrate 10. For example, the thickness of the auxiliary electrode 22 is greater than the thickness of the first electrode 21.

A pixel definition layer 23 is formed on the first electrode 21 and the auxiliary electrode 22, and the pixel definition layer 23 includes a lyophilic material layer 231 and a lyophobic material layer 232 that is stacked on the lyophilic material layer 231. The lyophilic material layer 231 is provided with a first sub-opening in the pixel region, the lyophobic material layer 232 is provided with a second sub-opening which coincides with the first sub-opening, a bottom surface of the lyophobic material layer 232 coincides (e.g., completely coincides) with a top surface of the lyophilic material layer 231, and the second sub-opening coincides with the first sub-opening to form a pixel opening 230. For example, the first electrode 21 is exposed through the pixel opening 230, that is, the first electrode 21 least partially overlaps with the pixel opening 230 in a direction perpendicular to the driving substrate 10, so that the pixel opening 230 defines the pixel region (i.e., a region where the OLED device is located).

Inside the pixel opening 230, a hole injection layer 24, a light emitting layer 25 and an electron injection layer 26 are sequentially formed from the bottom to the top. A second electrode 27 is formed on the electron injection layer 26 and the pixel definition layer 23. When a driving voltage is applied between the first electrode 21 and the second electrode 27, a driving current flows through a light emitting functional layer composed of the hole injection layer, the light emitting layer and the electron injection layer, thereby driving the light emitting layer to emit light. The light emitting layer 25 emits light of a desired color (e.g., red, green, blue, or white) according to the material of the light emitting layer 25, and emits light with a desired intensity according to the magnitude of the driving current flowing through the light emitting layer 25.

In the preparation method of the display substrate according to at least one embodiment of the present disclosure, after the hole injection layer solution is injected in the pixel opening (i.e., in the pixel region), voltages with opposite electrical properties are respectively applied to the first electrode and the auxiliary electrode, so that the first electrode exhibits the second electrical property opposite to the first electrical property, and the auxiliary electrode exhibits the first electrical property, thus causing the first electrode to generate an attractive force to the hole injection layer solution and causing the auxiliary electrode to generate a repulsive force to the hole injection layer solution. Therefore, in the process of drying and film formation of the hole injection layer solution, the hole injection layer solution is attracted by the first electrode and is deposited towards the first electrode; meanwhile, when solvent vapor volatilizes rapidly at the edge of the pixel region, the repulsive force generated by the auxiliary electrode to the hole injection layer solution inhibits solution in the center of the pixel region from flowing towards the edge of the pixel region, which prevents solute from migrating towards the edge of the pixel region, thereby avoiding the "coffee ring effect", avoiding the formation of a film morphology with a thicker edge and a thinner center, improving the thickness uniformity of the hole injection layer, and improving the uniformity of the light emission of OLED pixels.

In addition, the attractive force generated by the first electrode to the hole injection layer solution and the repulsive force generated by the auxiliary electrode to the hole injection layer solution act together to better inhibit the solution from climbing on an interface of the pixel definition layer, thereby further improving the thickness uniformity of the hole injection layer and improving the uniformity of the light emission of the OLED pixel.

For example, in the case where the thickness uniformity of the hole injection layer is good, good thickness uniformity can also be obtained when subsequent layers such as the hole transport layer, the light emitting layer and other organic layers are formed on the hole injection layer. Therefore, by adopting the preparation method provided by at least one embodiment of the present disclosure, OLED pixels with a good uniformity of film thickness can be obtained, and the uniformity of the light emission of the OLED pixel can be improved.

In one embodiment, the first electrical property is a positive electrical property. In the case where the first electrical property is the positive electrical property, the hole injection layer solution is positively charged, thus in the process of drying and film formation, it is necessary to apply a corresponding negative voltage to the first electrode so that the first electrode exhibits a negative electrical property, and to apply a corresponding positive voltage to the auxiliary electrode so that the auxiliary electrode exhibits the positive electrical property.

In at least one embodiment of the present disclosure, as illustrated in FIG. 2, the first electrical property is the negative electrical property, that is, the hole injection layer solution exhibits the negative electrical property, and that is, the hole injection layer solution is negatively charged. Thus, for example, a corresponding positive voltage is applied to the first electrode so that the first electrode exhibits the positive electrical property, and a corresponding negative voltage is applied to the auxiliary electrode so that the auxiliary electrode exhibits the negative electrical property. For example, the first electrode is usually an anode, and the voltage applied to the first electrode is a positive voltage during the operation of the OLED pixels. Therefore, by setting the hole injection layer solution to be negatively charged and applying a positive voltage to the first electrode, the first electrode can be applied with a positive voltage all the time during the process of drying and film formation of the hole injection layer solution and during the display process of the OLED pixels, thus avoiding opposite properties of voltages applied to the first electrode in the process of drying and film formation of the first electrode and in the display process, and simplifying the circuit structure in the driving substrate.

For example, the hole injection layer solution is a dispersion formed of water and an organic material for forming the hole injection layer. In at least one embodiment of the present disclosure, a material of the hole injection layer includes PEDOT:PSS (poly(3,4-ethylenedioxythiophene): poly(styrene sulfonic acid)), and the hole injection layer solution is a dispersion formed by PEDOT:PSS in water. Therefore, the hole injection layer solution exhibits the negative electrical property. In at least one embodiment of the present disclosure, the hole injection layer solution exhibits the negative electrical property, that is, the material of the hole injection layer exhibits the negative electrical property. Therefore, in the process of drying and film formation of the hole injection layer, the material of the hole injection layer is attracted by the first electrode and deposited on a surface of the first electrode. When the solvent vapor volatilizes rapidly at the edge of the pixel region, even if the solvent flows to the edge, the flow of the material of the hole injection layer to the edge is inhibited because of the repulsive force generated by the auxiliary electrode to the material of the hole injection layer, thereby preventing the solute from migrating to the edge of the pixel region, avoiding the "coffee ring effect", avoiding the formation of a film morphology with a thicker edge and a thinner center, improving the thickness uniformity of the hole injection layer, and improving the uniformity of the light emission of the OLED device.

The technical solutions of the embodiments of the present disclosure are described in detail below by illustrating a preparation process of the display substrate. For example, the "patterning process" in at least one embodiment of the present disclosure includes processes such as coating photoresist, mask exposure, development, etching, stripping photoresist, etc., the "photolithography process" in at least one embodiment of the present disclosure includes processes such as mask exposure, development, etc., and the evaporation, deposition, coating, etc. in at least one embodiment of the present disclosure are mature preparation processes in related technologies. The "thickness" is a dimension of a layer in a direction perpendicular to the display substrate.

Figure 3:
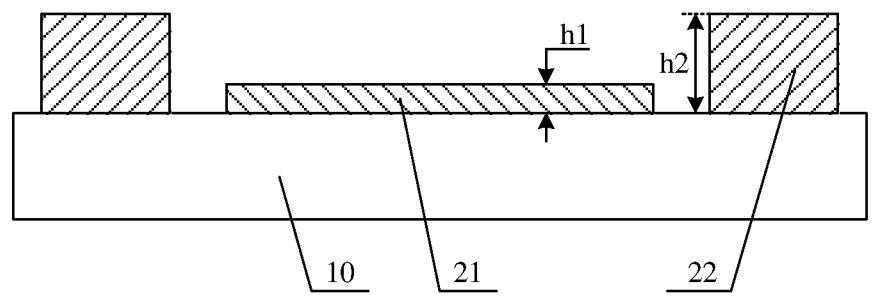
FIG. 3 is a schematic structural diagram of a display substrate after forming a first electrode and an auxiliary electrode thereon provided by at least one embodiment of the present disclosure.

FIG. 3 is a schematic structural diagram of a display substrate after forming a first electrode and an auxiliary electrode thereon provided by at least one embodiment of the present disclosure. For example, as illustrated in FIG. 3, the step of forming the first electrode and the auxiliary electrode on the driving substrate includes the following steps S11-S13.

Step S11: providing a driving substrate 10.

For example, the driving substrate 10 includes a base substrate, a driving structure layer disposed on the base substrate, and a planarization layer disposed on the driving structure layer. For example, the base substrate, the driving structure layer, and the planarization layer are sequentially disposed in a direction perpendicular to the base substrate.

For example, the base substrate can be a glass substrate, a quartz substrate, a plastic substrate (for example, a polyethylene terephthalate (PET) substrate, a polyimide substrate), or a substrate made of other suitable materials. For example, the base substrate can be a flexible base substrate. For example, a minimum value of a bending radius of the base substrate can be in a range of 10 mm to 30 mm (e.g., 20 mm), without being limited in the embodiments of the present disclosure.

For example, the driving structure layer includes a pixel circuit (e.g., a plurality of pixel circuits arranged in an array), and the pixel circuits include a suitable number of thin film transistors and storage capacitors.

For example, the planarization layer is configured to planarize a side of the driving structure layer away from the base substrate. For example, the planarization layer is made of an inorganic insulation material such as silicon oxide, silicon nitride, silicon oxynitride, etc., or is made of an organic insulation material such as polyimide, polyphthalamide, polyphthalamide, acrylic resin, benzocyclobutene, or phenolic resin, etc.

Step S12: forming (e.g., depositing) a first conductive film (e.g., a first electrode film) on the driving substrate 10, and patterning the first conductive film (e.g., the first electrode film) by a patterning process to form a first electrode 21 in the pixel region.

Step S13: depositing a second conductive film (e.g., a metal film) on the driving substrate 10 formed with the first electrode 21, and patterning the second conductive film (e.g., the metal film) by a patterning process to form an auxiliary electrode 22 surrounding the first electrode 21.

In the above method of forming the first electrode and the auxiliary electrode, the first electrode 21 is formed on the driving substrate 10 first, and then the auxiliary electrode 22 is formed thereon. For example, in other embodiments, the auxiliary electrode 22 can be formed on the driving substrate 10 first, and then the first electrode 21 is formed thereon. In a specific implementation, the order of formation of the first electrode 21 and formation of the auxiliary electrode 22 can be determined according to actual needs.

For example, the first electrode 21 can be formed of a transparent conductive material. For example, the transparent conductive material is selected from transparent metal oxides such as indium tin oxide (ITO), indium zinc oxide (IZO), etc. For example, the material of the auxiliary electrode 22 can include one or more selected from the group consisting of magnesium, silver, copper, aluminum, and the like. For example, the material of the auxiliary electrode 22 can be a single metal or an alloy formed of two or more kinds of metals. In this case, because the material of the first electrode 21 and the material of the auxiliary electrode 22 are different, it is required that the first electrode and the auxiliary electrode are formed separately by two patterning processes.

For example, in other embodiments, the material of the first electrode and the material of the auxiliary electrode can be the same, and in the case where the material of the first electrode and the material of the auxiliary electrode are the same, the first electrode and the auxiliary electrode can be simultaneously formed by a same patterning process. In the case where the first electrode and the auxiliary electrode are simultaneously formed by the same patterning process, an exposure process can be performed by a gray tone mask.

For example, as illustrated in FIG. 3, the thickness of the auxiliary electrode 22 is greater than the thickness of the first electrode 21. For example, the thickness (a dimension in the direction perpendicular to the driving substrate) of the auxiliary electrode 22 is in a range of 0 Å to 5000 Å. For example, the thickness of the first electrode 21 is h1, and the thickness h2 of the auxiliary electrode 22 is in a range of h1 to 5000 Å, that is, $h1 \leq h2 \leq 5000$ Å. For example, the thickness of the auxiliary electrode 22 is 5000 Å. The hole injection layer solution is formed on the first electrode (i.e., on a side of the first electrode 21 away from the driving substrate 10). For example, by allowing the thickness of the auxiliary electrode 22 to be greater than the thickness of the first electrode 21, the repulsive force generated by the auxiliary electrode 22 to the hole injection layer solution can act on the hole injection layer solution in a horizontal direction, thereby maximally inhibiting the hole injection layer solution from flowing from the center of the pixel region to the edge of the pixel region during the process of drying and film formation of the hole injection layer, and further avoiding the "coffee ring effect" and improving the film thickness uniformity of the hole injection layer.

For example, the first electrode 21 and the auxiliary electrode 22 are disposed on the planarization layer. For example, the first electrode 21 is electrically connected to a corresponding thin film transistor (driving transistor) of the pixel circuit in the driving structure layer, and thus, a corresponding voltage can be applied to the first electrode 21 by the driving substrate 10. For example, the auxiliary electrode 22 is electrically connected to the driving structure layer of the driving substrate 10, so that a corresponding voltage can be applied to the auxiliary electrode 22 by the driving substrate 10.

In one embodiment, step S2, that is, the forming the pixel definition layer on the driving substrate formed with the first electrode and the auxiliary electrode, includes the following steps S21-S23.

Step S21: forming a lyophilic material film on the driving substrate 10 formed with the first electrode 21 and the auxiliary electrode 22.

Step S22: patterning the lyophilic material film by a patterning process to form a lyophilic material layer 231.

Step S23: forming a lyophobic material film on the lyophilic material layer, and patterning the lyophobic material film by a photolithography process to form a lyophobic material layer 232.

Figure 4:
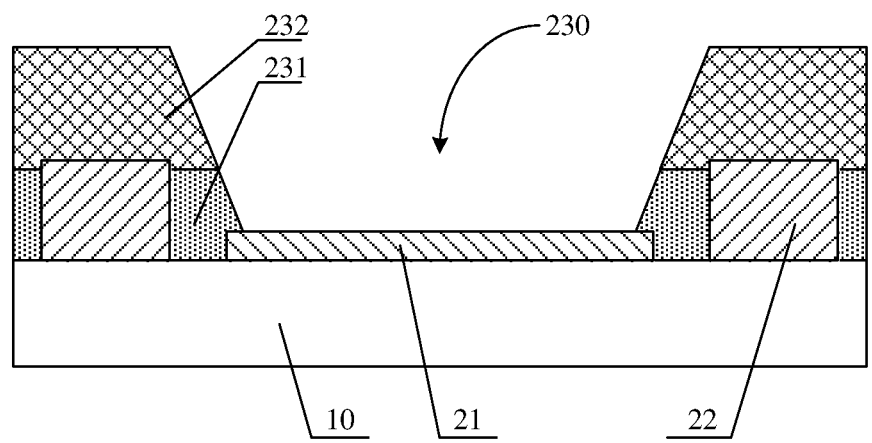
FIG. 4 is a schematic structural diagram of a display substrate after forming a pixel definition layer thereon provided by at least one embodiment of the present disclosure.

FIG. 4 is a schematic structural diagram of a display substrate after forming a pixel definition layer thereon provided by at least one embodiment of the present disclosure. For example, as illustrated in FIG. 4, the lyophilic material layer 231 is provided with a first sub-opening in the pixel region, the lyophobic material layer 232 is provided with a second sub-opening which coincides with the first sub-opening, a bottom surface of the lyophobic material layer 232 (i.e., a surface of the lyophobic material layer 232 close to the driving substrate 10) coincides (e.g., completely coincides) with a top surface of the lyophilic material layer 231 (i.e., a surface of the lyophilic material layer 231 away from the driving substrate 10), and the second sub-opening and the first sub-opening coincide with each other to form a pixel opening 230. For example, as illustrated in FIG. 4, the first electrode 21 is exposed through the pixel opening 230, that is, the first electrode 21 at least partially overlaps with the pixel opening 230 in the direction perpendicular to the driving substrate 10, so that the pixel opening 230 defines the pixel region (i.e., a region where the OLED device is located).

In another embodiment, step S2, that is, the forming the pixel definition layer on the driving substrate formed with the first electrode and the auxiliary electrode, includes the following steps S21'-S23'.

Step S21': sequentially forming a lyophilic material film and a lyophobic material film on the driving substrate formed with the first electrode and the auxiliary electrode.

Step S22': patterning the lyophobic material film by a photolithography process to form a lyophobic material layer 232 which is formed with a second sub-opening in the pixel region.

Step S23': etching the lyophilic material film by adopting the lyophobic material layer 232 as a mask to form a lyophilic material layer 231 which is formed with a first sub-opening coincident with the second sub-opening.

For example, the first sub-opening and the second sub-opening form a pixel opening 230, the first electrode 21 is exposed by the pixel opening 230, so that the pixel opening 230 defines the pixel region (i.e., the region where the OLED device is located).

For example, the thickness of the lyophilic material layer 231 is in a range of 0 Å to 3000 Å. For example, the thickness of the lyophilic material layer 231 is greater than the thickness of the first electrode 21, and the thickness of the lyophilic material layer 231 is less than the thickness of the auxiliary electrode 22. Therefore, when the hole injection layer solution is formed in the pixel region by a solution process (e.g., ink jet printing), the solution is uniformly formed on the surface of the first electrode and will not climb too high at the interface of the pixel definition layer. Even if the solution climbs during the process of drying and film forming, the repulsive force generated by the auxiliary electrode 22 to the hole injection layer solution prevents the hole injection layer solution from climbing, thus preventing the hole injection layer solution from climbing onto an interface of the lyophobic material layer 232. And therefore, a climbing highness will not exceed the thickness of the lyophilic material layer 231, thus well controlling the climbing highness of the hole injection layer solution and controlling the climbing highness to be within the range of the thickness of the lyophilic material layer. Therefore, the climbing highness of an edge of the hole injection layer 24 is much lower than that of a common technique of film formation, thus further improving the film thickness uniformity of the hole injection layer in the pixel region and improving the uniformity of the light emission of the OLED pixel.

In one embodiment, the thickness of the auxiliary electrode 22 is in a range of 4500 Å to 5500 Å, and for example, the thickness of the lyophilic material layer 231 can be in a range of 2500 Å to 3500 Å. For example, the thickness of the auxiliary electrode 22 is 5000 Å, and the thickness of the lyophilic material layer 231 can be 3000 Å.

For example, the lyophilic material layer 231 is made of a lyophilic material, and the lyophilic material is a material having attraction to a solution (e.g., the hole injection layer solution) of a dissolved organic electroluminescent material. For example, the lyophobic material layer 232 is made of a lyophobic material, and the lyophobic material is a material having repellency to the solution (e.g., the hole injection layer solution) of a dissolved organic electroluminescent material. In one embodiment, for example, the lyophilic material can be silicon dioxide or silicon nitride, and the lyophobic material can be any one selected from the group consisting of fluorinated polyimide, fluorinated polymethyl methacrylate and polysiloxane.

For example, step S3, that is, the injecting the hole injection layer solution in the pixel opening 230 (the hole injection layer solution exhibits the first electrical property), includes: forming the hole injection layer solution in the pixel opening 230 (that is, in the pixel region), by using at least one selected from the group consisting of inkjet printing, nozzle coating, spin coating, and the like. For example, the hole injection layer solution is inkjet printed in the pixel region by inkjet printing.

For example, in the step S4, the applying voltages with opposite electrical properties to the first electrode and the auxiliary electrode, respectively, so that the first electrode exhibits the second electrical property opposite to the first electrical property, and the auxiliary electrode exhibits the first electrical property, includes: respectively applying corresponding voltages to the first electrode and the auxiliary electrode by the driving substrate, so that the first electrode exhibits the second electrical property opposite to the first electrical property, and the auxiliary electrode exhibits the first electrical property.

Figure 5:
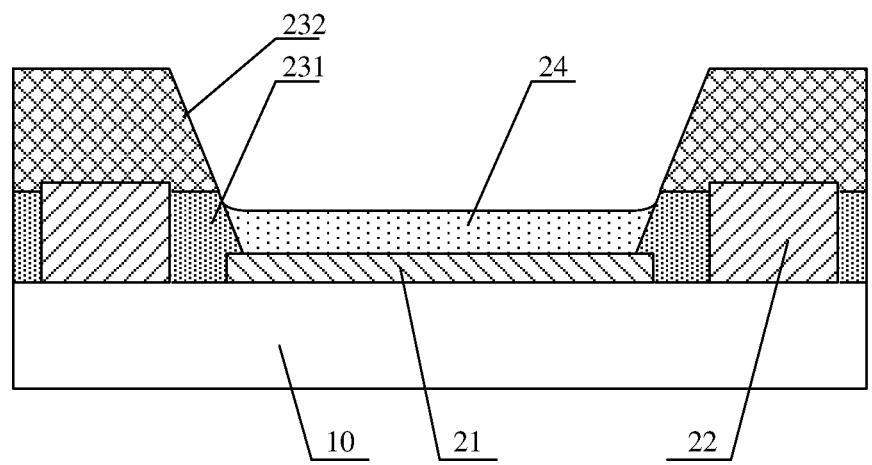
FIG. 5 is a schematic structural diagram of a display substrate after forming a hole injection layer thereon provided by at least one embodiment of the present disclosure.

For example, in the step S4, the drying the hole injection layer solution into a film to form the hole injection layer, includes: drying the hole injection layer solution into a film to form the hole injection layer under a condition that the first electrode is kept to exhibit the second electrical property and the auxiliary electrode is kept to exhibit the first electrical property, as illustrated in FIG. 5. FIG. 5 is a schematic structural diagram of the display substrate after forming the hole injection layer on the display substrate.

In one embodiment, the hole injection layer solution is negatively charged, and a positive voltage is applied to the first electrode by the driving substrate and a negative voltage is applied to the auxiliary electrode by the driving substrate.

For example, the OLED pixel further includes film layers such as a hole transport layer, a light emitting layer, etc., that are sequentially disposed on the hole injection layer. Therefore, for example, the preparation method of the display substrate provided by at least one embodiment of the present disclosure can further include the following step S5.

Step S5: sequentially forming organic layers such as a hole transport layer, a light emitting layer, an electron transport layer, a hole injection layer and the like on the hole injection layer, and drying and baking the organic layers. In the subsequent formation of the organic layers, for example, an ink jet printing method or a vapor deposition method can be adopted.

For example, the display substrate provided by the embodiments of the present disclosure can be a display substrate such as an organic light emitting diode (OLED) display substrate or a quantum dot light emitting diode (QLED) display substrate, and the specific type of the display substrate is not limited in the embodiments of the present disclosure.

For example, in the case where the display substrate is an organic light emitting diode display substrate, the light emitting layer can include a small molecular organic material or a polymer molecular organic material, and can be a fluorescent light emitting material or a phosphorescent light emitting material, and can emit a red light, a green light, a blue light, or a white light, etc. For example, in the case where the display substrate is a quantum dot light emitting diode (QLED) display substrate, the light emitting layer can include a quantum dot material, such as a silicon quantum dot, a germanium quantum dot, a cadmium sulfide quantum dot, a cadmium selenide quantum dot, a cadmium telluride quantum dot, a zinc selenide quantum dot, a lead sulfide quantum dot, a lead selenide quantum dot, an indium phosphide quantum dot, an indium arsenide quantum dot, and the like, and a particle diameter of the quantum dot is in a range of 2 nm-20 nm.

For example, the preparation method of the display substrate provided by at least one embodiment of the present disclosure can further include the following step S6.

Step S6: forming a second electrode (usually a cathode) of the OLED pixel and an encapsulation layer covering the OLED pixel.

For example, the second electrode (e.g., cathode) is a structure formed on an entirety of the surface of the display substrate, and for example, the second electrode (e.g., cathode) can include a metal material such as lithium (Li), aluminum (Al), magnesium (Mg), silver (Ag), and the like. For example, because the second electrode (e.g., cathode) may be formed as a very thin layer, the second electrode (e.g., cathode) has good light transmittance.

For example, the encapsulation layer can include a single-layer encapsulation structure or a multi-layer encapsulation structure, and the multi-layer encapsulation structure includes, for example, a stacked layer consisting of an inorganic encapsulation layer and an organic encapsulation layer, thereby improving the encapsulation effect of the display substrate. For example, the encapsulation layer can include an inorganic encapsulation layer, an organic encapsulation layer, and another inorganic encapsulation layer that are stacked in the direction perpendicular to the driving substrate. For example, the inorganic encapsulation layer is made of an inorganic transparent insulation material, and the organic encapsulation layer is made of an organic transparent insulation material. For example, the inorganic transparent insulation material can be selected from the group consisting of silicon oxide, silicon nitride, and silicon oxynitride. For example, the organic transparent insulation material can be selected from the group consisting of polyimide, polyphthalamide, polyphthalamide, acrylic resin, benzocyclobutene and phenolic resin.

For example, the step of forming the pixel definition layer on the driving substrate formed with the first electrode and the auxiliary electrode includes: forming a lyophilic material layer on the driving substrate formed with the first electrode and the auxiliary electrode; and forming a lyophobic material layer on a side of the lyophilic material lay away from the driving substrate. For example, the lyophilic material layer has a first sub-opening, the lyophobic material layer has a second sub-opening, and the first sub-opening and the second sub-opening form the pixel opening.

For example, a structure of the display substrate prepared by the preparation method of the display substrate provided by at least one embodiment of the present disclosure is illustrated in FIG. 5. The display substrate includes the driving substrate, the first electrode and the auxiliary electrode that are arranged on the driving substrate, the first electrode is in the pixel region, and the auxiliary electrode is at the periphery of the first electrode; the display substrate further includes the pixel definition layer, which is arranged on both the first electrode and the auxiliary electrode and defines the pixel regions, and includes the hole injection layer which is arranged on the pixel definition layer and in the pixel region.

In one embodiment, the thickness of the first electrode is h1, the thickness of the auxiliary electrode is h2, and h1≤h2≤5000 Å.

In one embodiment, the material of the auxiliary electrode includes one or more selected from the group consisting of magnesium, silver, copper or aluminum.

In one embodiment, the pixel definition layer includes a lyophilic material layer disposed on a side of the first electrode and the auxiliary electrode facing away from the driving substrate, and a lyophobic material layer disposed on a side of the lyophilic material layer facing away from the driving substrate.

In one embodiment, the thickness of the lyophilic material layer is in a range of 0 Å-3000 Å.

In one embodiment, the thickness of the lyophilic material layer is greater than the thickness of the first electrode and less than the thickness of the auxiliary electrode.

In one embodiment, the thickness of the auxiliary electrode is in a range of 4500 Å-5500 Å, and the thickness of the lyophilic material layer is in a range of 2500 Å-3500 Å.

At least one embodiment of the present disclosure provides a display substrate, and the display substrate includes a driving substrate, a first electrode, an auxiliary electrode, a pixel definition layer, and a hole injection layer. The driving substrate includes a driving circuit and a dielectric layer covering the driving circuit; the first electrode and the auxiliary electrode are on a side of the dielectric layer of the driving substrate away from the driving circuit; the auxiliary electrode at least partially surrounds the first electrode; the pixel definition layer is on a side of the first electrode and the auxiliary electrode away from the driving substrate; the pixel definition layer includes a pixel opening, the first electrode is at least partially exposed through the pixel opening and is electrically connected to the driving circuit; and the hole injection layer is in the pixel opening and stacked with the first electrode.

For example, the dielectric layer can be made of an inorganic insulation material such as silicon oxide, silicon nitride, silicon oxynitride, etc., or is made of an organic insulation material such as polyimide, polyphthalamide, polyphthalamide, acrylic resin, benzocyclobutene, or phenolic resin, and the like. For example, the dielectric layer can be implemented as a planarization layer to planarize a side of the driving circuit (e.g., the driving structure layer) away from the base substrate.

For example, the material of the hole injection layer includes PEDOT:PSS. For example, the display substrate includes a plurality of first electrodes and a plurality of hole injection layers; the pixel definition layer includes a plurality of pixel openings; the plurality of first electrodes are at least partially exposed through the plurality of pixel openings (e.g., a part of each first electrode is exposed), respectively. For example, the display substrate further includes a plurality of pixel regions and a plurality of OLED devices respectively corresponding to the plurality of pixel regions; the plurality of pixel openings respectively define the plurality of pixel regions; and each of the plurality of OLED devices includes a corresponding first electrode and a corresponding hole injection layer.

For example, the thickness h1 of the first electrode in a direction perpendicular to the driving substrate is less than or equal to the thickness h2 of the auxiliary electrode in the direction perpendicular to the driving substrate, and h2 is less than or equal to 5000 Å. For example, the thickness of a stacked layer consisting of the hole injection layer and the first electrode in the direction perpendicular to the driving substrate is less than the thickness of the auxiliary electrode in the direction perpendicular to the driving substrate. For example, an orthographic projection of the auxiliary electrode on the driving substrate is within an orthographic projection of the pixel definition layer on the driving substrate. For example, the auxiliary electrode completely surrounds the first electrode and is spaced apart from the first electrode.

For example, the pixel definition layer includes a lyophilic material layer on a side of the first electrode and the auxiliary electrode facing away from the driving substrate, and a lyophobic material layer on a side of the lyophilic material layer facing away from the driving substrate. For example, the thickness of the lyophilic material layer in the direction perpendicular to the driving substrate is greater than a thickness of the first electrode in the direction perpendicular to the driving substrate; the thickness of the lyophilic material layer in the direction perpendicular to the driving substrate is less than the thickness of the auxiliary electrode in the direction perpendicular to the driving substrate; and the auxiliary electrode is in direct contact with the lyophobic material layer. For example, the thickness of the lyophilic material layer in the direction perpendicular to the driving substrate is greater than the thickness of a stacked layer consisting of the hole injection layer and the first electrode in the direction perpendicular to the driving substrate.

In one example, the driving circuit includes a pixel circuit and an electrode terminal; the pixel circuit is configured to receive a gate signal and a data signal, and to generate a driving current based on the gate signal and the data signal; the first electrode is electrically connected to the pixel circuit to receive the driving current generated by the pixel circuit; and the auxiliary electrode is electrically connected with the electrode terminal to receive a ground voltage (for example, 0 V) supplied to the electrode terminal by the driving circuit. For example, by allowing the auxiliary electrode to receive the ground voltage supplied to the electrode terminal by the driving circuit, adverse effects of the auxiliary electrode on the display effect of the display substrate can be suppressed (avoided).

In another example, in at least one example of the display substrate, the auxiliary electrode is floating or grounded in operation. For example, by making the auxiliary electrode floating or grounded in operation, the adverse effects of the auxiliary electrode on the display effect of the display substrate can be suppressed (avoided).

Figure 6:
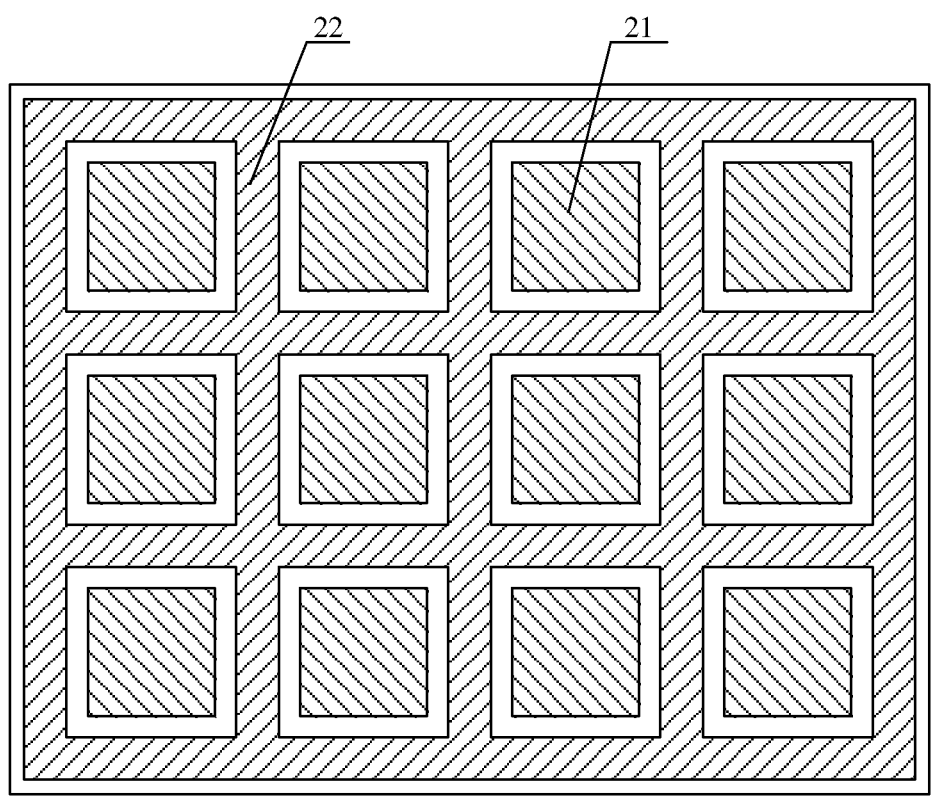
FIG. 6 is a schematic top view of a display substrate prepared by the preparation method of the display substrate provided by at least one embodiment of the present disclosure.

FIG. 6 is a schematic top view of a display substrate prepared by the preparation method of the display substrate provided by at least one embodiment of the present disclosure. As illustrated in FIG. 6, the display substrate includes a plurality of pixel regions, and the first electrodes 21 are disposed in corresponding pixel regions. The plurality of pixel regions are arranged in an array. For example, the plurality of first electrodes 21 are arranged in an array, and the plurality of first electrodes 21 are respectively arranged in the plurality of pixel regions. For example, the plurality of first electrodes 21 are in one-to-one correspondence with the plurality of pixel regions, and each of the plurality of first electrodes 21 is disposed in a corresponding pixel region.

For example, the auxiliary electrode 22 is disposed between adjacent two columns of pixel regions, or the auxiliary electrode 22 is disposed between adjacent two rows of pixel regions. For example, the auxiliary electrode 22 surrounds (e.g., completely surrounds) the first electrode 21 (e.g., each of the plurality of first electrodes 21). For example, the auxiliary electrode 22 is provided both between adjacent two columns and between adjacent two rows of pixel regions. Therefore, the hole injection layer which is formed has a uniform thickness in a circumferential direction, and the uniformity of the light emission of the OLED pixel is improved.

For example, in FIG. 6, the auxiliary electrode 22 surrounding the first electrode 21 is continuous in structure, and for example, in other embodiments, the auxiliary electrode 22 surrounding the first electrode 21 can include a plurality of sub-electrodes arranged at intervals.

It should be noted that although the auxiliary electrode illustrated in FIG. 6 completely surrounds the first electrode 21, the embodiments of the present disclosure are not limited to this case. In some examples, the auxiliary electrode can partially surround the first electrode 21. For example, the auxiliary electrode is in a ring shape as a whole but has a plurality of fractures.

For example, the display substrate includes a plurality of OLED devices (e.g., light emitting elements) and a plurality of pixel circuits; and the plurality of pixel circuits are configured to drive the plurality of OLED devices to emit light, respectively.

At least one embodiment of the present disclosure further provides a display apparatus, and the display apparatus includes the display substrate provided by the above-mentioned embodiments. The display apparatus can be any product or component with display function, such as a mobile phone, a tablet computer, a television, a display, a notebook computer, a digital photo frame, a navigator and the like.

It should be noted that, those skilled in the art should understand that other components of the display apparatus (e.g., control device, image data encoding/decoding device, row scan driver, column scan driver, clock circuit, etc.) can adopt applicable components, which are not described in detail herein and should not be taken as limitations on the embodiments of the present disclosure.

Although the present disclosure has been described in detail with general description and specific embodiments above, it is obvious to those skilled in the art that some modifications or improvements can be made based on the embodiments of the present disclosure. Therefore, all such modifications or improvements made without departing from the spirit of this disclosure are within the protection scope claimed in this disclosure.

What have been described above are only specific implementations of the present disclosure, the protection scope of the present disclosure is not limited thereto. The protection scope of the present disclosure should be based on the protection scope of the claims.

What is claimed is:

1. A display substrate, comprising:
    a driving substrate, a first electrode, an auxiliary electrode, a pixel definition layer and a hole injection layer, wherein the driving substrate comprises a driving circuit and a dielectric layer covering the driving circuit;
    the first electrode and the auxiliary electrode are on a side of the dielectric layer of the driving substrate away from the driving circuit;
    the auxiliary electrode at least partially surrounds the first electrode;
    the pixel definition layer is on a side of the first electrode and the auxiliary electrode away from the driving substrate;
    the pixel definition layer comprises a pixel opening, and the first electrode is at least partially exposed through the pixel opening and is electrically connected to the driving circuit;
    the hole injection layer is in the pixel opening and stacked with the first electrode;
    the pixel definition layer comprises a lyophilic material layer on a side of the first electrode and the auxiliary electrode facing away from the driving substrate, and a lyophobic material layer on a side of the lyophilic material layer facing away from the driving substrate.

2. The display substrate according to claim 1, wherein the display substrate comprises a plurality of first electrodes and a plurality of hole injection layers;
    the pixel definition layer comprises a plurality of pixel openings;
    the plurality of first electrodes are at least partially exposed through the plurality of pixel openings, respectively.

3. The display substrate according to claim 2, further comprising a plurality of pixel regions and a plurality of organic light emitting diode (OLED) devices respectively corresponding to the plurality of pixel regions;
    the plurality of pixel openings respectively define the plurality of pixel regions; and
    each of the plurality of OLED devices comprises a corresponding first electrode of the plurality of first electrodes and a corresponding hole injection layer of the plurality of hole injection layers.

4. The display substrate according to claim 3, wherein each of the plurality of OLED devices further comprises a light emitting layer and an electron injection layer;
    the light emitting layer is on a side of the corresponding hole injection layer away from the driving substrate; and
    the electron injection layer is on a side of the light emitting layer away from the driving substrate.

5. The display substrate according to claim 1, wherein a thickness h1 of the first electrode in a direction perpendicular to the driving substrate is less than or equal to a thickness h2 of the auxiliary electrode in the direction perpendicular to the driving substrate, and h2 is less than or equal to 5000 Å.

6. The display substrate according to claim 5, wherein a thickness of a stacked layer consisting of the hole injection layer and the first electrode in the direction perpendicular to the driving substrate is less than the thickness of the auxiliary electrode in the direction perpendicular to the driving substrate.

7. The display substrate according to claim 1, wherein an orthographic projection of the auxiliary electrode on the driving substrate is within an orthographic projection of the pixel definition layer on the driving substrate.

8. The display substrate according to claim 1, wherein the auxiliary electrode completely surrounds the first electrode and is spaced apart from the first electrode.

9. The display substrate according to claim 1, wherein a thickness of the lyophilic material layer in a direction perpendicular to the driving substrate is greater than a thickness of the first electrode in the direction perpendicular to the driving substrate;
    the thickness of the lyophilic material layer in the direction perpendicular to the driving substrate is less than a thickness of the auxiliary electrode in the direction perpendicular to the driving substrate; and
    the auxiliary electrode is in direct contact with the lyophobic material layer.

10. The display substrate according to claim 9, wherein the thickness of the lyophilic material layer in the direction perpendicular to the driving substrate is greater than a thickness of a stacked layer consisting of the hole injection layer and the first electrode in the direction perpendicular to the driving substrate.

11. The display substrate according to claim 1, wherein a material of the hole injection layer comprises poly(3,4-ethylenedioxythiophene):poly(styrene sulfonic acid) (PEDOT:PSS).

12. The display substrate according to claim 1, wherein the auxiliary electrode is floating or grounded in operation;
    the display substrate comprises a plurality of pixel regions, the plurality of pixel regions are arranged in an array, and the auxiliary electrode is between adjacent two columns of the pixel regions or/and between adjacent two rows of the pixel regions;

a material of the auxiliary electrode comprises at least one selected from the group consisting of magnesium, silver, copper or aluminum; and a thickness of the auxiliary electrode is 4500 Å~5500 Å.

13. A display apparatus, comprising: a display substrate, wherein the display substrate comprises a driving substrate, a first electrode, an auxiliary electrode, a pixel definition layer and a hole injection layer, the driving substrate comprises a driving circuit and a dielectric layer covering the driving circuit;

the first electrode and the auxiliary electrode are on a side of the dielectric layer of the driving substrate away from the driving circuit;

the auxiliary electrode at least partially surrounds the first electrode;

the pixel definition layer is on a side of the first electrode and the auxiliary electrode away from the driving substrate;

the pixel definition layer comprises a pixel opening, and the first electrode is at least partially exposed through the pixel opening and is electrically connected to the driving circuit; and the hole injection layer is in the pixel opening and stacked with the first electrode;

the pixel definition layer comprises a lyophilic material layer on a side of the first electrode and the auxiliary electrode facing away from the driving substrate, and a lyophobic material layer on a side of the lyophilic material layer facing away from the driving substrate.

\* \* \* \* \*

UNITED STATES PATENT AND TRADEMARK OFFICE
CERTIFICATE OF CORRECTION

| | |
|---|---|
| PATENT NO. | : 11,637,265 B2 |
| APPLICATION NO. | : 16/853097 |
| DATED | : April 25, 2023 |
| INVENTOR(S) | : Zhang |

It is certified that error appears in the above-identified patent and that said Letters Patent is hereby corrected as shown below:

On the Title Page

Item (54) and in the Specification Column 1, Lines 1-3:
"DISPLAY SUBSTRATE HAVING PIXEL DEFINITION LAYER COMPRISES A LYOPHILIC AND LYOPHOBIC MATERIALS"
To correctly read:
-- A DISPLAY HAVING PIXEL DEFINITION LAYER COMPRISES A LYOPHILIC AND LYOPHOBIC MATERIALS --

Signed and Sealed this
Fifteenth Day of August, 2023

Katherine Kelly Vidal
*Director of the United States Patent and Trademark Office*